United States Patent
Mayer et al.

(10) Patent No.: US 6,315,883 B1
(45) Date of Patent: Nov. 13, 2001

(54) ELECTROPLANARIZATION OF LARGE AND SMALL DAMASCENE FEATURES USING DIFFUSION BARRIERS AND ELECTROPOLISHING

(75) Inventors: Steven T. Mayer; Robert J. Contolini, both of Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/412,837

(22) Filed: Oct. 5, 1999

Related U.S. Application Data
(60) Provisional application No. 60/105,700, filed on Oct. 26, 1998.

(51) Int. Cl.[7] .............. C25D 5/02; C25D 5/48; C25D 7/12; C25F 3/16
(52) U.S. Cl. .......... 205/123; 205/220; 205/157; 205/640
(58) Field of Search ............ 205/640, 123, 205/157, 220

(56) References Cited

U.S. PATENT DOCUMENTS

| | | | |
|---|---|---|---|
| 3,849,270 | 11/1974 | Takagi et al. | 204/129.1 |
| 5,096,550 | 3/1992 | Mayer et al. | 204/129 |
| 5,256,565 | 10/1993 | Bernhardt et al. | 437/228 |
| 5,486,234 | 1/1996 | Contolini et al. | |
| 6,056,864 | * 5/2000 | Cheung et al. | 205/222 |
| 6,083,835 | * 7/2000 | Shue et al. | 438/687 |
| 6,153,521 | * 11/2000 | Cheung et al. | 438/687 |

OTHER PUBLICATIONS

Robert J. Contolini, Anthony F. Bernhard, and Steven T. Mayer, Electrochemical Planarization for Multilevel Metallization, J. Electrochem Soc., vol. 141, No. 9, Sep. 1994, 9 pages.

* cited by examiner

*Primary Examiner*—Donald R. Valentine
(74) *Attorney, Agent, or Firm*—Beyer Weaver & Thomas LLP

(57) ABSTRACT

A disclosed electroplanarization process involves "masking" certain regions of a wafer surface during electropolishing. The regions chosen for masking are features of relatively low aspect ratio (i.e., features that are wider than they are deep). The masking is accomplished with a material of relatively low ionic conductivity, which effectively slows or blocks transport of the metal ions produced during electropolishing. Examples of masking materials include concentrated phosphoric acid and certain polymers.

32 Claims, 9 Drawing Sheets

ELECTROPLANARIZATION OF LARGE AND SMALL DAMASCENE FEATURES USING DIFFUSION BARRIERS AND ELECTROPOLISHING

CROSS-REFERENCE TO RELATED APPLICATION

This application claims priority under 35 USC 119(e) from U.S. Provisional Application No. 60/105,700, having Steven T. Mayer and Robert J. Contolini as inventors, filed Oct. 26, 1998, and titled "MATERIALS AND PROCESSES FOR ELECTROPLANARIZATION OF LARGE AND SMALL DAMASCENE FEATURES USING DIFFUSION BARRIERS AND ELECTROPOLISHING. Provisional Application No. 60/105,700 is incorporated herein by reference for all purposes.

BACKGROUND OF THE INVENTION

This invention relates to surface planarization technology. More specifically, it relates to electropolishing technology for planarizing surfaces having low aspect ratio recesses or trenches.

In the fabrication of integrated circuits, as the number of levels in an interconnect technology is increased, the stacking of additional layers on top of one another produces a more and more rugged topography. Without planarization, the microscopic canyons that result on the integrated circuit surface from stacking of device features create a topography that would eventually lead to defects in the integrated circuit that would make the circuit unusable.

One method of planarization used in the art is chemical mechanical polishing (CMP). CMP is a process that uses a mixture of abrasives and pads to polish the surface of the integrated circuit. Unfortunately, CMP polishing techniques are difficult to control; the end-point can be difficult to detect. They are also expensive. The high equipment and waste handling cost and low throughput contribute the overall expense of CMP.

Another method of planarization involves an electrolytic technique such as electropolishing. Electropolishing is a low cost alternative technique to CMP. Lower capital cost, easier waste handling, and much higher processing rates make it a desirable alternative to CMP. Electropolishing is a method of polishing metal surfaces by applying an electric current through an electrolytic bath, as described for example in McGraw-Hill Encyclopedia of Science & Technology, pp. 810–811, 1982. The process may be viewed as the reverse of electroplating. Various patents describe such electropolishing techniques.

U.S. Pat. No. 5,096,550 to Mayer et al. ('550 patent), describes a method and apparatus for the removal of metal in the formation of planarized interconnects for integrated circuits. The Mayer et al. patent is incorporated herein by reference for all purposes. The Mayer et al. method and apparatus employ an electro-removal technique, including generally electrochemical etching and particularly electropolishing. A primary object of the '550 patent is to provide a spatially uniform polishing, etching or removal rate by controlling both the edge effects and the larger spatial non-uniformities. A second object of the '550 patent is to polish the surface, that is, to reduce surface roughness at the same time as etching it. A third object of the '550 patent is to remove material from the surface rapidly.

U.S. Pat. No. 3,849,270 to Takagi et al. describes a process of manufacturing semiconductor devices using electrolytic etching to remove a coating layer from an insulating layer.

U.S. Pat. No. 5,256,565 to Bernhardt et al. for electrochemical planarization describes a method and apparatus for forming a thin film planarized metal interconnect which is flush with the surrounding dielectric layer. In one described embodiment, a planarized metal layer is formed by controlled deposition, using an isotropic or other self-planarization process, of a layer having a depth at least about half the width of the widest feature to be filled in the dielectric layer. The metal layer is then etched back by electropolishing.

A problem arises during the electropolishing of surfaces in which a large number of low aspect ratio (larger width than depth) features exist. Trenches cut in a dielectric layer (for a damascene process) to define contact pads often have low aspect ratios. Conformal metalization processes typically do not "close" such features because to do so would require depositing a very thick metal layer, which would be uneconomical to add and later remove. Conventional electropolishing techniques can planarize a surface in which the feature to be planarized is no more than perhaps three times as wide as it is deep. For features wider than these, the rate of removal is essentially uniform everywhere, making electropolishing planarization very difficult, if not impossible.

Electroplating is one conformal deposition process. Because electroplating is highly isotropic, it can be shown both theoretically and experimentally that high aspect ratio features (i.e. depth to width>3:1) are rapidly filled, and the metal above them becomes rapidly planarized (due to the fact that film growth is not directionally dependent). Therefore, electroplating is a preferred method of metalization. Typically a metalization thickness of ½ the feature width is needed to close the cleft over the feature. Further addition of metal reduces the size of the cleft above the feature. Surfaces in which sufficient metal to fill and produce small clefts above high aspect ratio features will fill low aspect ratio features, but the latter features exhibit large recesses in the filled profile equal to the original feature depth (see FIG. 3) which are very difficult to planarize using conventional electropolishing technology. Today, features that vary in size by two orders of magnitude are typical. A 1 $\mu$m deep feature can have widths of from 0.2 $\mu$m to 100 $\mu$m. The current invention enables materials and methods for accomplishing planarization of damascene filled surfaces of a large range of feature sizes.

The current state of electropolishing technology has additional difficulties. For example, electropolishing typically requires highly viscous electrolyte baths (e.g., 85% phosphoric acid ($H_3PO_4$) in water, or with some added ethylene glycol). While these baths are effective in achieving good polishing and planarization rates, they make it difficult to remove defect-causing bubbles and to handle the fluids in general. Note that a hydrogen generating reaction may take place at the cathode. The hydrogen can become entrained in the electrolyte, complicating tool design and presenting a potential safety hazard. In addition, these baths also have high resistivities, making for large power requirements and substantial amounts of generated heat (which must be removed to maintain a constant process control).

What is needed therefore is improved electropolishing technology for planarizing conductive layers on integrated circuits and other substrates.

SUMMARY OF THE INVENTION

The present invention overcomes the above difficulties associated with electroplanarization by "masking" certain regions of a wafer surface during electropolishing.

Preferably, the regions chosen for masking are features of relatively low aspect ratio (i.e., features that are wider than they are deep). The masking is accomplished with a material of relatively low ionic conductivity, and diffusivity which effectively slows or blocks transport of the metal ions produced during electropolishing.

One aspect of this invention provides a method of electroplanarizing a substrate (e.g., a partially fabricated integrated circuit) surface having recesses surrounded by substantially flat field regions. The method may be characterized by the following sequence: (a) selectively applying a diffusion barrier film to the recesses and (b) electropolishing the substrate surface in a manner that removes material from the recesses more slowly than from the field regions to thereby increase the planarity of the substrate surface. The invention is particularly beneficial when applied to substrate surfaces in which the recesses have an aspect ratio of at most about 1:1.

Any suitable process may be used to apply the diffusion barrier film. Examples include dipping, spraying, and metering. Preferably, the diffusion barrier film is applied in a manner that gives it a substantially planar surface. This may be accomplished by spraying the surface of the film with a solvent for the film while the substrate is spinning.

The diffusion properties of the diffusion barrier film are important to its functioning. Preferably, it has a diffusion coefficient for ions of the material to be removed that is lower than the diffusion coefficient for such ions in the primary electropolishing bath electrolyte. In specific embodiments, the diffusion barrier film has a diffusion coefficient for the ions that varies inversely (and often non-linearly) with the concentration of the ions in the diffusion barrier film (e.g. copper).

In some embodiments, the diffusion barrier film is a viscous liquid that is soluble in an electropolishing bath electrolyte. In one specific embodiment, the diffusion barrier film is phosphoric acid having a concentration of at least about 25% by weight (more preferably between about 40 and 85% by weight). Such diffusion barrier film may include one or more of water, propylene carbonate, and ethylene carbonate. Typically, the film will also include a salt of the material to be removed (e.g., a copper salt). Other components that may be included in the film include wetting agents, brightening agents, and compounds that increase the kinetic overpotential of the electropolishing cathode.

Generally, the diffusion barrier film may be soluble or insoluble in the electropolishing bath electrolyte. It may be conductive or non-conductive to ions generated from the substrate during the electropolishing. In a preferred embodiment, the diffusion barrier film is a polymeric film such as a nylon, polyvinylidene difluoride (PVDF), polyacrylonitrile (PAN), polymethylacrylonitrile (PMAN), polyvinylchloride (PVC), and ethylene propylene diene monomer (EPDM).]Another aspect of this invention provides a method of forming conductive features via a damascene process. The method may be characterized by the following sequence: (a) providing a partially fabricated integrated circuit having a dielectric layer with trenches where said conductive features are to be formed; (b) forming a substantially conformal layer of conductive material over the dielectric layer, whereby the conductive material has a surface comprising recesses over the trenches and substantially flat field regions around the trenches; (c) selectively applying a diffusion barrier film to the recesses; (d) electropolishing the conductive material surface, whereby the conductive material is removed from the recesses more slowly than from the field regions to thereby increase the planarity of the conductive material surface; and (e) removing the conductive material at a substantially uniform rate over the surface of the conductive material until reaching the dielectric layer, whereby said conductive features remain in said trenches, insulated from one another by regions of the dielectric layer.

In this process, the conductive features may include at least one of vias, interconnect lines, and contact pads. At least some of the trenches for these conductive features may have an aspect ratio of at most about 1:1, and often at most about 1:3 (e.g., an aspect ratio of 1:6).

Any number of processes may be employed to form the substantially conformal layer of conductive material on the dielectric layer. In a preferred embodiment, electroplating is employed for this purpose. Examples of other conformal processes include conformal vapor deposition techniques, sputtering, and evaporation. Preferably, the conductive material is a metal such as copper or an alloy of copper. The diffusion barrier film may have a composition as described above in the discussion of the first embodiment. The process of removing the conductive material at a substantially uniform rate may involve chemical mechanical polishing or wet etching, for example. In one embodiment, electropolishing planarizes the surface of the conductive material layer and another process such as CMP removes the remaining thickness of conductive material lying above top of the dielectric layer.

These and other features and advantages of the present invention will be described below with reference to the associated drawings.

DESCRIPTION OF THE PREFERRED EMBODIMENTS

This invention enables electroplanarization by "electropolishing" such that both large (e.g., >15 $\mu$m wide)

features as well as small (e.g., <15 μm wide) features filled with metal can be planarized to produce a substantially flat substrate in which embedded metal remains in a dielectric/insulating media to produce a so-called damascene structure. An initial operation in this process involves the manufacture of recessed trenches, via holes, pad structures, or the like into the dielectric substrate. The openings are then filled with a metal by a conventional process such as sputtering, vapor deposition, or electroplating. A minimum amount of metal must be added to the part in order to completely fill the feature, but often some degree of additional metal is deposited to help prepare the surface for subsequent planarization by electropolishing, possibly in conjunction with another planarization technique.

The invention is primarily described in terms of electropolishing; however, the methods and apparatus can also be used for electrochemical etching in general. Therefore, a reference to polishing may also be interpreted as etching or removal.

Figure 1A:
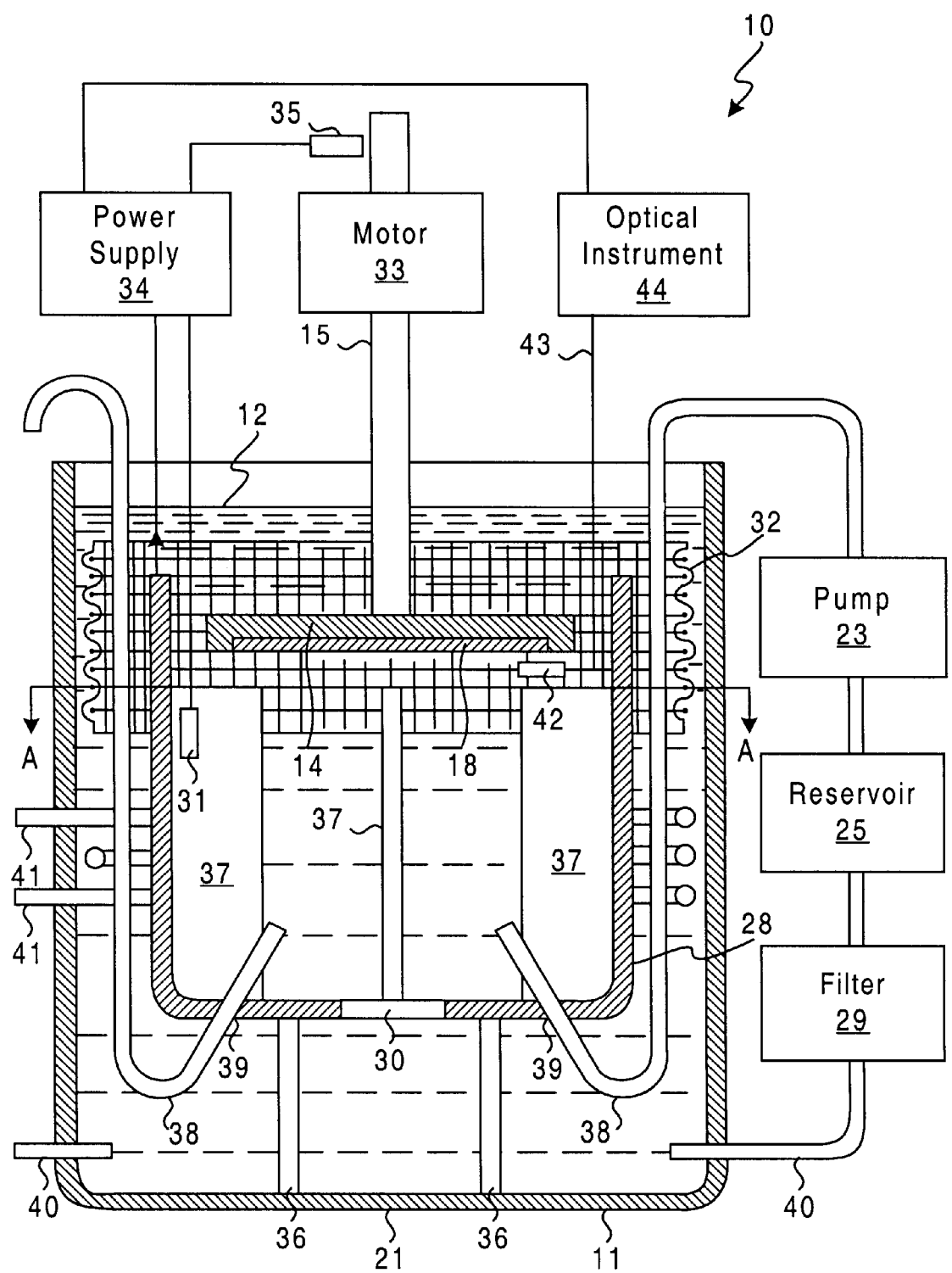
FIG. 1A is a schematic illustration shown in a cross-sectional side view of an electropolishing tool that may be used to electropolish a substrate surface in accordance with this invention.

One process and associated apparatus that may be employed to planarize a conductive material in accordance with this invention is depicted in FIGS. 1A–8. FIGS. 1A and 1B depict an electropolishing apparatus (cell) 10 that may be used with this invention. An apparatus such as this is described in more detail in U.S. Pat. No. 5,096,550. Cell 10 is formed of a containment vessel or tank (cell body) 11 filled with electropolishing solution 12 (sometimes referred to herein as "electropolishing bath electrolyte"). Important physical properties of the solution are its viscosity and its electrical conductivity.

The sample to be polished 18 (the "workpiece" or anode) is mounted in a holder 14. Sample 18 includes some regions where the metal is protected by a diffusion barrier film and other regions where the metal is exposed and available for full electropolishing. In some embodiments, holder 14 and sample 18 together form an extended anode, in the sense that the surface of the holder nearest to the workpiece is made of the material to be electropolished, copper for example, and is electropolished along with the workpiece. This extended anode arrangement removes edge or loading effects from the edge of the workpiece to the surface of the holder. Insertion of electric field shaping dielectric elements can also be used to influence the current distribution at the edge.

Anode 18 is attached to a shaft 15 of FIG. 1A so that the anode 18 can be rotated by means of a motor 33. In the apparatus of FIG. 1A, the anode 18 is positioned horizontally with the workpiece surface facing downward in the Earth's gravitational field. The preferred embodiment draws upon the concepts associated with a rotating disk electrode (RDE), often used in theoretical studies of kinetics and mass transfer in electrochemical systems. Solutions of the momentum and mass transport of the RDE system are well-known (e.g. J. Newmann, Electrochemical Systems, Prentice-Hall, Englewood N.J., 1973), and demonstrate that under certain conditions, the current distribution to the disk will be uniform. This arrangement is not essential (but may be useful) to practicing this invention.

Figure 1B:
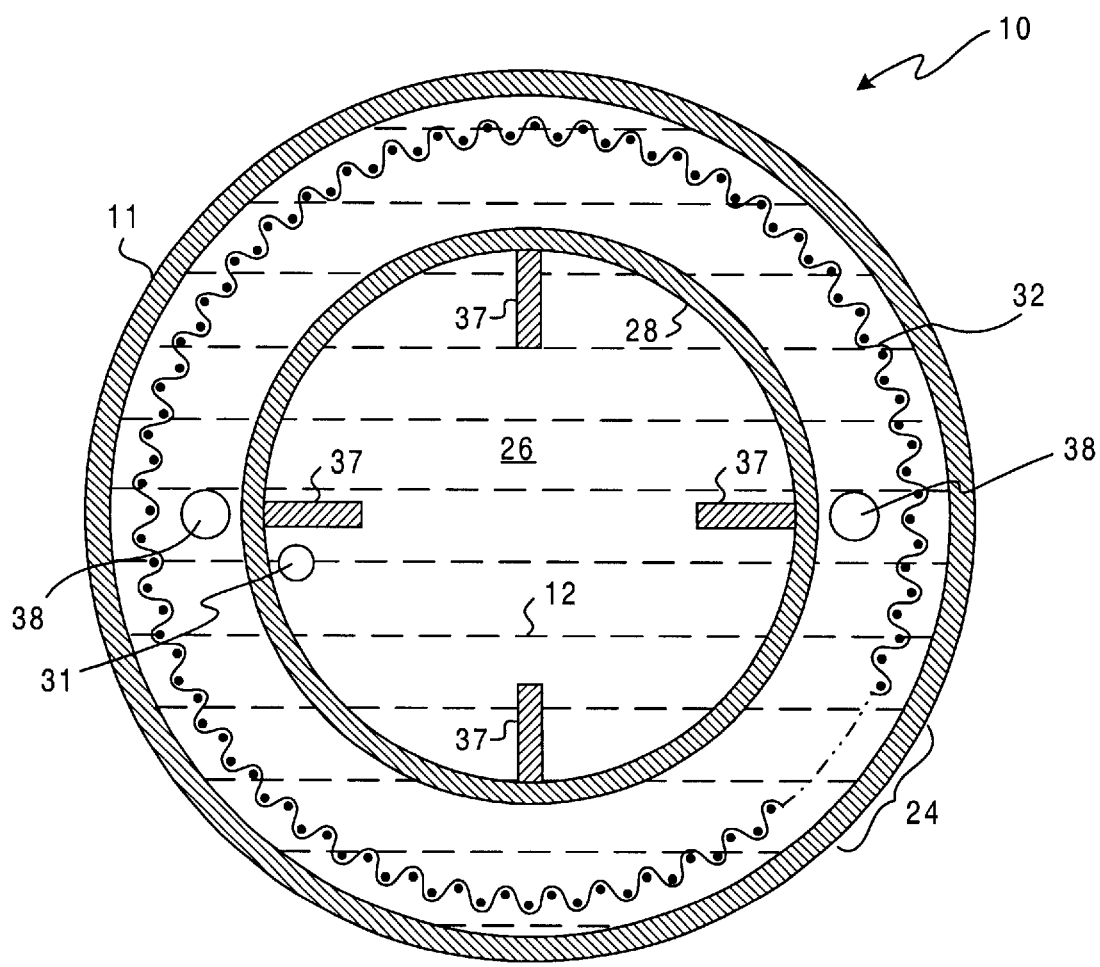
FIG. 1B is a cross-sectional bottom view of the electropolishing tool shown in FIG. 1A.

As mentioned, one problem sometimes encountered during electropolishing is that bubbles formed at the cathode or otherwise introduced into the solution can migrate (rise in the vertical arrangement) and settle on the anode surface. These bubbles will cause local non-uniformities in the anode surface (e.g., unpolished or overpolished spots). To address this problem, the apparatus of FIGS. 1A and B introduces a separation means or barrier between the cathode and the anode through which electrical current can pass, but bubbles cannot. This is accomplished by means of a non-conducting solid barrier (chamber or cup) 28 with a hole or aperture 30 in the bottom. A cathode 32, e.g., a screen, is positioned at the top of the containment vessel 11 external to the anode-cathode barrier 28 and extends, at least partially, around the anode-cathode barrier 28. As shown in FIG. 1B, cathode 32 extends entirely around the inside surface of tank 11, but a portion, e.g., section 24, can be omitted to permit better visual observation of the anode. Anode 18 extends into the volume bounded by barrier 28, which defines an anode chamber volume 26 therein. Current can pass through hole 30, but, since the hole 30 is below the level of the cathode 32, no bubbles pass through it and enter the anode chamber volume 26. Instead, bubbles generated by the cathode rise to the surface of the solution over the cathode 32. As explained elsewhere herein, the present invention allows the use of low-viscosity electropolishing bath electrolytes that reduce the likelihood of damage from entrained bubbles. So some electropolishing cells of this invention do not require the mechanical measures provided herein such as barrier 28.

As shown in FIG. 1A, anode 18 and cathode 32 are electrically connected to a voltage source or power supply 34 (the connection to anode 18 is shown through shaft 15, e.g., by an electrical brush 35). Suitable electrical connection to the workpiece can be made through the anode holder 14. Voltage source 34 provides the necessary voltage-current to produce polishing. The anode-cathode barrier cup 28 sits on legs 36 above the bottom 21 of containment vessel 11. A reference electrode 31 is immersed in the solution inside the anode-cathode barrier cup 28. Fluid inlets 38 extend into the cell body 11 and through holes 39 in the bottom of cup 28 to inject or remove solution 12 in the interior of cup 28 near anode 18. Fluid outlets 40 also extend into cell body 11 outside cup 28, and act as an inlet or outlet of solution 12 for the cell. Generally, solution is injected into the anode-cathode barrier cup 28 to alter the relative polishing rate uniformity, and is removed from the chamber for filtration and cooling purposes. Inlets 38 and outlets 40 can be used to continuously or otherwise recirculate solution 12 through the cell. For example, solution removed through an outlet 40 may be filtered by a filter 29, then placed in a reservoir 25, from which it is pumped by a pump 23 through inlet 38 into chamber 28. Filter 29 can also be combined with or replaced by a cooling chamber.

A constantly rotating anode (particularly in the face down orientation) tends to generate a wavy surface. This phenomena can be reduced by minimizing the rotation of the fluid which will naturally arise in the anode-cathode barrier cup compartment by either: 1) adding fluid with no rotational inertia into the chamber, along the natural flow lines which impinge on the anode 18 (as accomplished by fluid inlets 38); or 2) adding baffles 37 to the bath whose size and shape minimize the tendency of the fluid to spin in the chamber, but do not significantly alter the overall primary current distribution.

Because a significant amount of heat can be generated inside the apparatus, the temperature of the cell will rise during its use if means for the removal of this heat are not available. Generally, the cell temperature changes the rate and operating voltage of electropolishing. Therefore, to maintain a controlled electropolishing rate, it may be necessary to install a heat exchange mechanism for this system. Two possible embodiments are to have cooling coils 41 inside the bath, as shown in FIG. 1A, or to cool the electrolyte externally of the cell, e.g., combining or replacing the filtration line with a cooling chamber 29 or cooling the reservoir 25.

Preferably the voltage of the cell be controlled by a "three electrode system". In such a system, the voltage of the anode is set and maintained with respect to an unpolarized reference electrode 31 of FIG. 1A (i.e., an electrode through which no d.c. current passes), but the anode surface voltage is driven by varying the potential of the cathode. Such a system ensures the electrochemical stability of the anode interface from being thrown into a potential regime where unwanted side reactions occur (e.g., oxygen evolution at the anode), as well as provides a controlled approach to surface film formation and steady state electropolishing.

Cell 10 may be equipped to provide for end point detection and current shut-off. It is generally desirable to leave a small amount of metal on the workpiece because the polishing rate for isolated structures (such as embedded lines) can be much greater than for a surface completely covered with the metal being polished. If the metal of the unpatterned areas is permitted to clear, the embedded, planarized features will be etched more than desired. One method of detecting when the unpatterned areas are about to clear is to observe a change in the reflectivity of the surface near the edge of the sample. If slightly less material is deposited at the edge of the sample or the polishing rate is slightly greater at the edge, then the metal will clear there first. In one preferred embodiment, an adhesion layer (e.g., of chromium, tantalumor titanium) is sputtered onto a silicon or dielectric substrate. After the sputtering of a thin "seed" layer of copper metal, for example, onto this adhesion layer, copper is electroplated onto the substrate. When the copper is finally polished away at the edge, this adhesion layer is exposed. Since the adhesion layer is silver or "metallic" in color, it is easily distinguishable from copper. The electropolishing process does not substantially attack the adhesion layer. A difference in the reflectivity or color of the substrate with respect to that of the material being polished can therefore be observed and the current shut off. For example, a suitable optical instrument can be use to observe this change and automatically shut the current off. As shown in FIG. 1A, fiber optic probe 42 can be set nearby and facing the portion of the anode which clears first and an appropriate optical instrument 44 is placed on the other end of the fiber optic 43 to detect the reflectivity change. Instrument 44 is electrically connected to power supply 34 to shut off the current. In a preferred embodiment, the barrier cup and the containment vessel are made of glass, and there is a separation in the cathode so that the anode can be viewed from outside the apparatus.

Another method of end-point detection and current shut off is simply monitoring the current versus time for a potentiostatic process. After an initial transition period (10–100 second depending on processing conditions), the current reaches a steady state value. As long as copper is present everywhere on the surface, that value remains essentially unchanged. As the part clears of copper, the current drops. By monitoring the change in current with time, one can observe decrease in current at the end of the process and avoid over-polishing of the part.

An important distinction between the electropolishing of this invention and that performed conventionally is that the polishing here is accomplished after application of, and through a thin film that is applied to the wafer surface. The applied films are composed of a polymer or a high-viscosity electropolishing material. The use of such film essentially allows the use an electrolyte bath of much lower viscosity and higher conductivity than that of previous electropolishing tools. One important benefit of this invention is that the bulk electrolyte does not necessarily have to be an "electropolishing" electrolyte at all. Using two electrolyte types in this manner (i.e. one for solution and one for the film) allows selection of a bath electrolyte with little or no bubble (mainly hydrogen) generation, very low viscosity (easy fluid handling and bubble separation), and very high conductivity (low power consumption and heat generation). For example, by using baths of low viscosity, high water content and high metal (e.g. copper) content, the overall cell can be electrochemically balanced to produce no gas at the cathode (hydrogen) and simply remove metal from the working part. Such cell can also deposit metal at nearly 100% efficiency at the cathode, allowing for a completely undepleted and continuously reusable electrolyte bath.

FIGS. 2–8 present a series of cross-sectional views of a substrate surface during various stages of a process in accordance with this invention. Generally, this invention may be employed with any type of substrate surface on which features or "recesses" are to be filled with a conductive material. The invention is particularly beneficial as applied to planarization of conductive layers deposited on partially fabricated integrated circuits. In a preferred embodiment, the planarization technique of this invention is applied during a damascene process for forming inlaid conductive structures (e.g., pads or interconnects) in a patterned dielectric layer of a partially fabricated integrated circuit.

Figure 2:
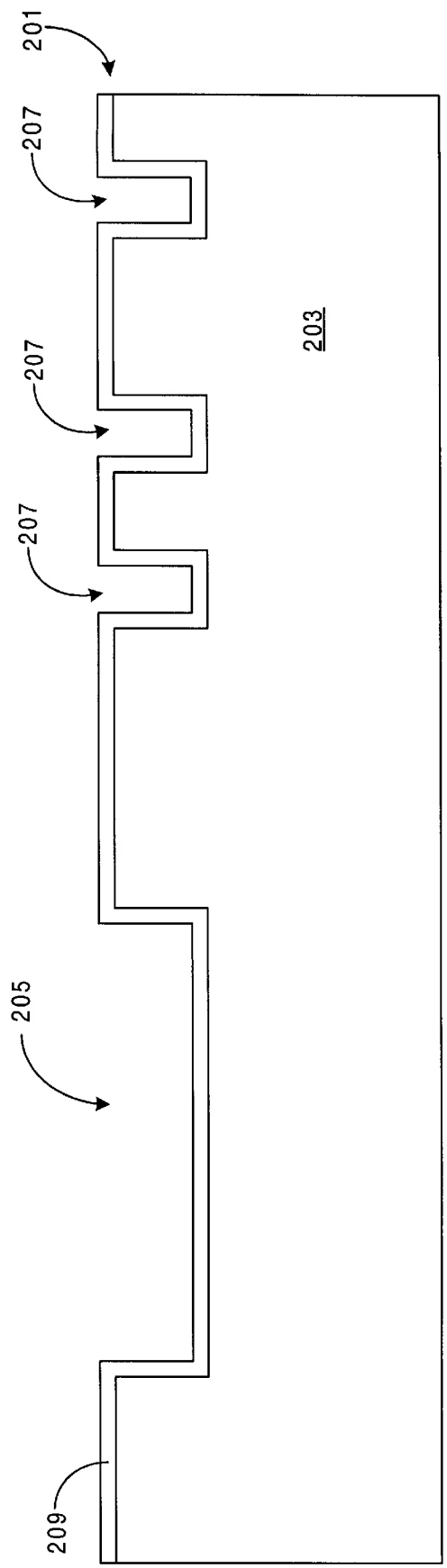
FIG. 2 is a cross-sectional depiction of an integrated circuit having a patterned dielectric layer with damascene features.

Turning now to FIG. 2, the upper layers 201 of a partially fabricated integrated circuit are depicted. These include a patterned dielectric layer 203 formed of a material such as a silicon oxide (e.g., silicon dioxide), aluminum nitride, paraffin, and organic and inorganic aerogels such as those described in U.S. Pat. Nos. 5,470,802, 5,494,858, 5,504,042, and 5,523,615 all naming Gnade, Cho, and Smith as inventors and in U.S. Pat. No. 5,420,168 issued to Mayer, Kaschmitter, and Pekala. Each of these patents is incorporated herein by reference for all purposes. Note that the pattern on dielectric layer 203 includes features of varying aspect ratios. Generically, these are referred to herein as trenches or trench structures; they can embody various shapes and sizes of recesses for pads, vias, and the like. Dielectric layer 203 may be patterned using any suitable technique such as anisotropic dry etching techniques. A low aspect ratio trench 205 is shown along with three high aspect ratio trenches 207. In the depicted embodiment, a thin "barrier" or "adhesion" layer 209 (comprised of, for example, titanium, TiW (titanium tungsten), tantalum, chromium, etc.) covers the surface of dielectric substrate 203.

As mentioned above, low aspect ratio trench features such as trench 205 are of particular relevance to the present invention. High aspect ratio trench features such as trenches 207 provide a much less significant problem because subsequently deposited conformal layers can be easily planarized at these locations by electropolishing. This invention finds particular usefulness when applied to substrates having trench features with aspect ratios of at most about 1:1 (depth:width). Even more importantly, the invention may be applied to trench features having even lower aspect ratios of at most about 1:3. These are not hard and fixed limits on substrates that are useable with the present invention. The range of feature geometries that can benefit from the present invention is somewhat dependent upon the type of conductive material deposited as well as its thickness, density, etc.

Figure 3:
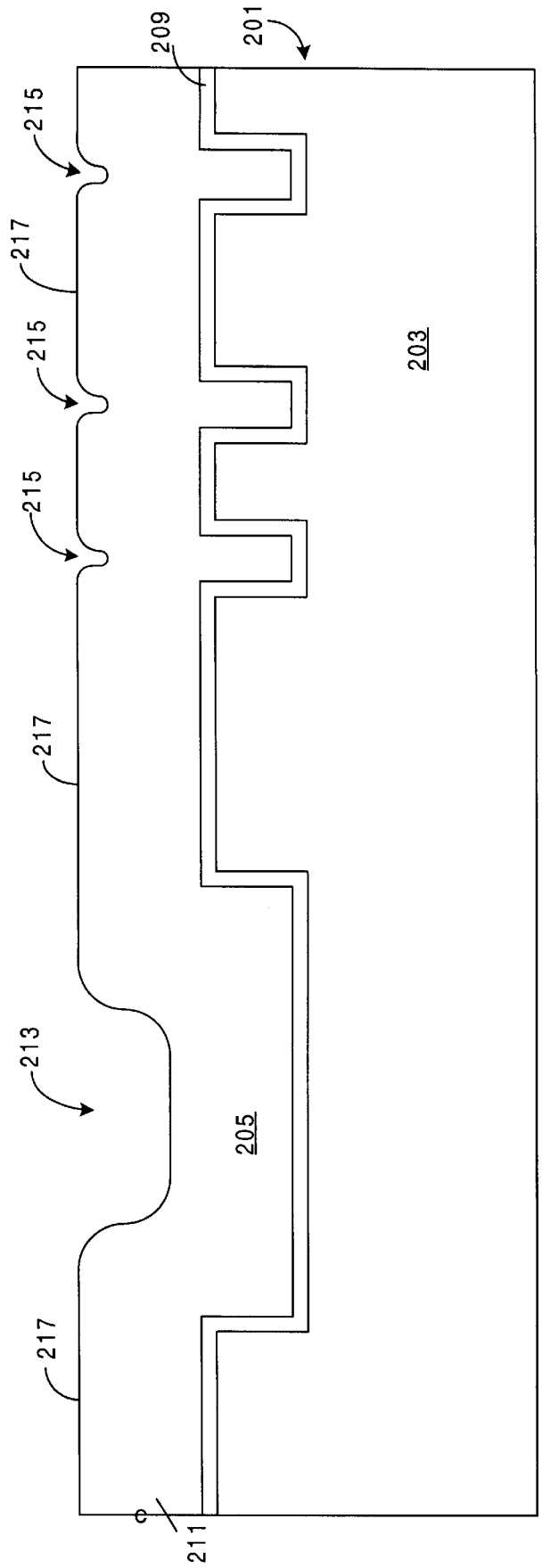
FIG. 3 is a cross-sectional depiction of the structure of FIG. 2 after a layer of conductive material has been conformally formed thereon.

Turning now to FIG. 3, a layer of conductive material 211 has been conformally provided on upper layers 201 of low aspect ratio features. Note that conformal layer 211 includes a recess 213 overlying low aspect ratio trench 205. Layer 211 also includes a series of small recesses or "nips" 215 overlying high aspect ratio trenches 207. For a given plating thickness, the size of these nips decrease with decreasing feature width. By way of example, nips 215 may have a width and depth on the order of about $\frac{1}{3}$ to $\frac{1}{10}$ the width of the original feature. These nip features can be planarized by conventional electropolishing. Surrounding recess 213 and nips 215 are relatively planar field regions 217.

Conformal layer 211 may be formed by various techniques. In a particularly preferred embodiment, it is formed by electroplating a conductive material onto the substrate. Prior to electroplating, a thin layer of the conductive material (a "seed layer") may be deposited by another process (e.g., vapor deposition). As an alternative to electroplating, another suitable conformal process such as chemical vapor deposition, sputtering, evaporation, and the like may form the conformal layer. Note that, regardless of which process is employed, a conformal layer will follow the contours of the underlying dielectric substrate 203. Thus, recess 213 typically has an aspect ratio mirroring that of trench 205.

In many embodiments, conductive layer 211 will be a metal such as copper or an alloy of copper. Note that metals are typically employed as interconnects and contact pads in integrated circuits. Copper is a particularly preferred metal for use in damascene type processes to form interconnects and contact pads. Other metals that may be suitable for use for this invention include aluminum, silver and gold] In some cases, layer 211 may be formed from a non-metal conductive material, so long as that conductive material is susceptible to planarization via electropolishing.

Figure 4:
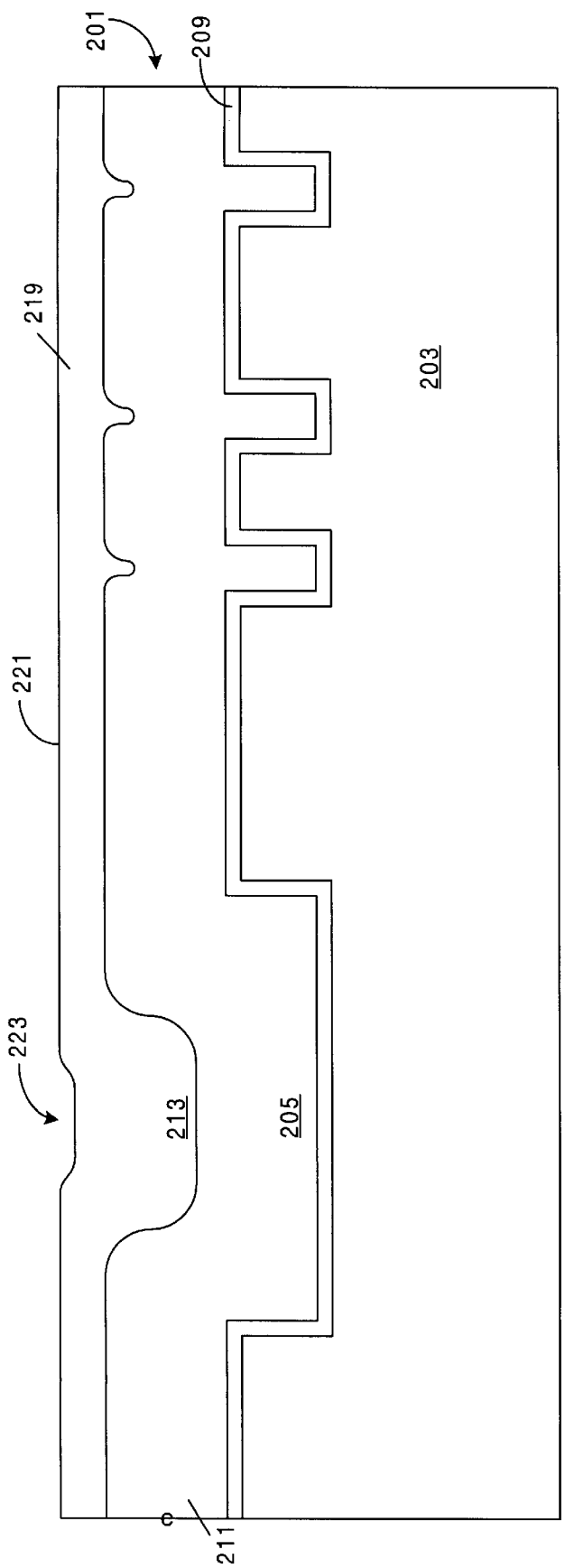
FIG. 4 is a cross-sectional depiction of the structure of FIG. 3 after a layer of diffusion barrier film has been deposited on the conductive layer.

FIG. 4 depicts the substrate of FIG. 3 after a diffusion barrier film 219 has been initially deposited. Note that it has a top surface 221 which is substantially more planar than the top surface of conductive material layer 211. In the embodiment depicted, however, a small deviation 223 remains over top of recess 213. Depending upon the method of application, and the material comprising diffusion barrier film 219, such deviations may or may not be present. If they are present, it may be beneficial to conduct further processing to mitigate or remove them. Further, it may be desirable to conduct further processing to thin layer to 19 so that top surface 221 is very close to or flush with field regions 217.

Figure 5:
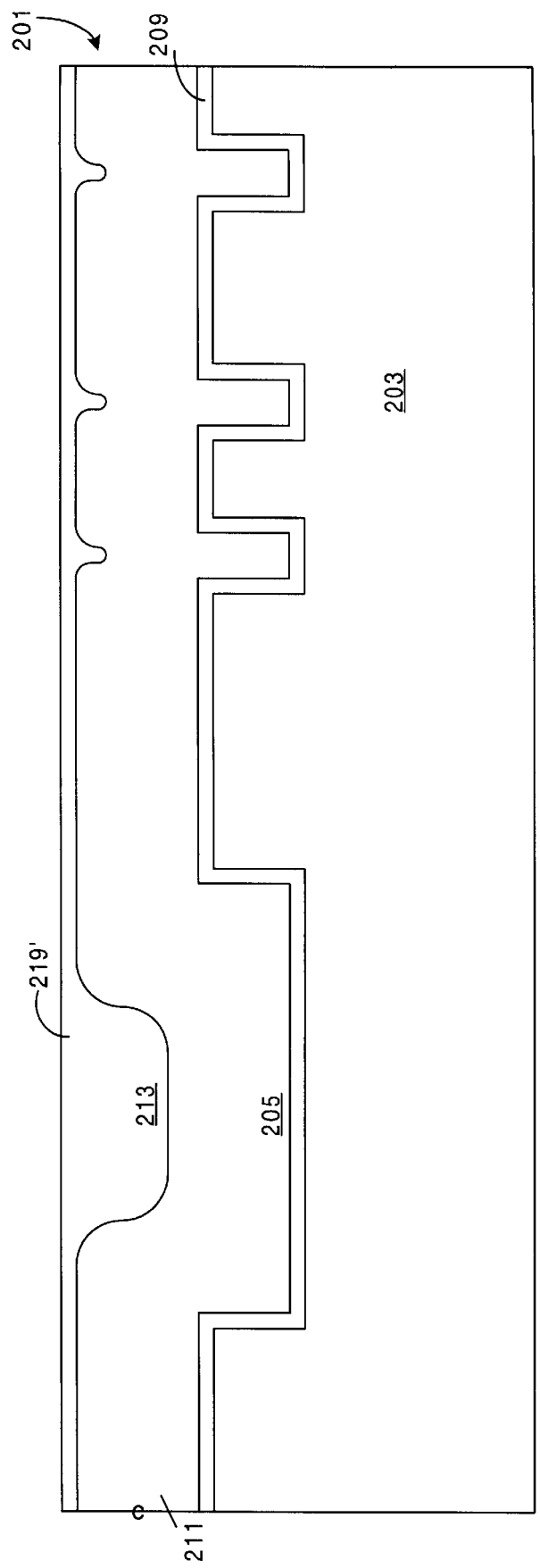
FIG. 5 is a cross-sectional depiction of the structure of FIG. 4 after the diffusion barrier film has been planarized and thinned.

FIG. 5 depicts the upper layers of the substrate 201 together with a planarized diffusion barrier film 219'. This structure of the diffusion barrier film may be obtained by specific processing such as rotating the substrate while spraying the surface of the diffusion barrier film with a solvent for the film. Such processes tend to thin and planarize the diffusion barrier film. Alternatively, the structure of film 219' illustrated in FIG. 5 may be obtained directly upon application of the film, assuming that the film and the process of applying it are sufficiently non-conformal.

The top surface of the substrate as illustrated in FIG. 5 is now in a condition for planarization by electropolishing. Note that film 219' has, in effect, been selectively deposited on a region of layer 211 corresponding to recess 213. Assuming that film 219' affects mass transport to conductive layer 211, this selective positioning allows region-specific electropolishing as explained in more detail below.

Figure 6:
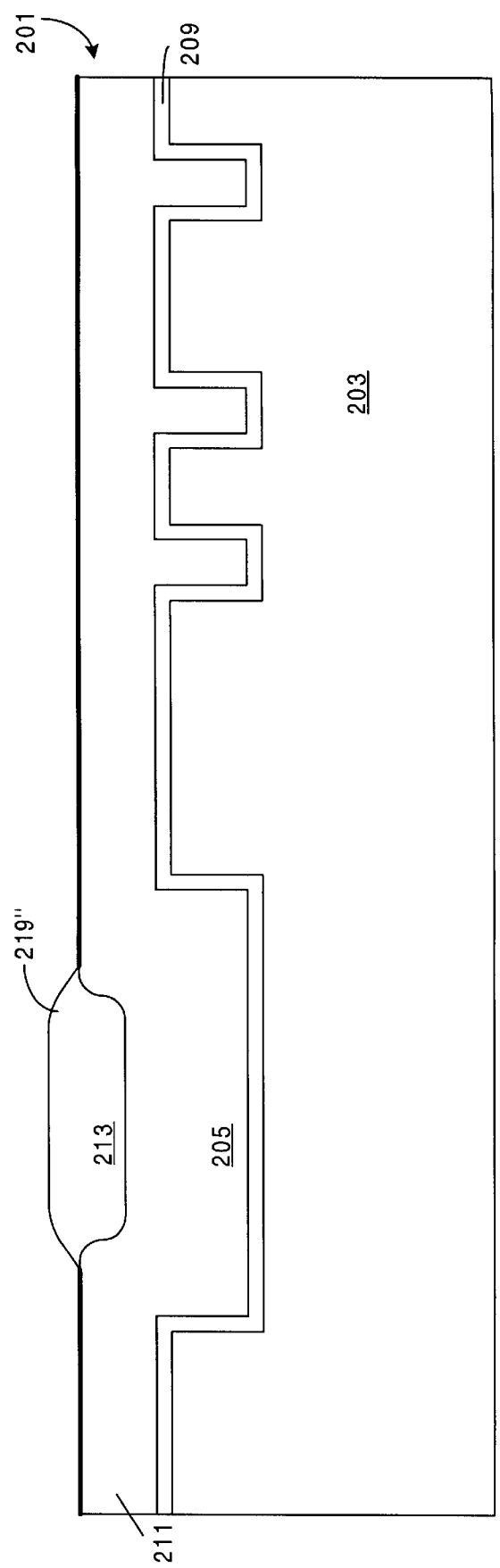
FIG. 6 is a cross-sectional depiction of the structure of FIG. 5 after electropolishing is partially completed.

FIG. 6 illustrates the condition of upper layers 201 midway through an electropolishing procedure. In the embodiment depicted, the diffusion barrier film is at least partially soluble in an electropolishing bath electrolyte (see, FIG. 1A). As a consequence, at least some of planarized diffusion barrier film 219' dissolves during electropolishing. As depicted in FIG. 6, a partially removed diffusion barrier film 219 " remains. Note that the film is thicker above recess 213. Note also that the upper surface of conductive layer 211 is becoming substantially planarized. This results because the conductive material is removed more slowly from the recess than from the field regions about the recess.

Figure 7:
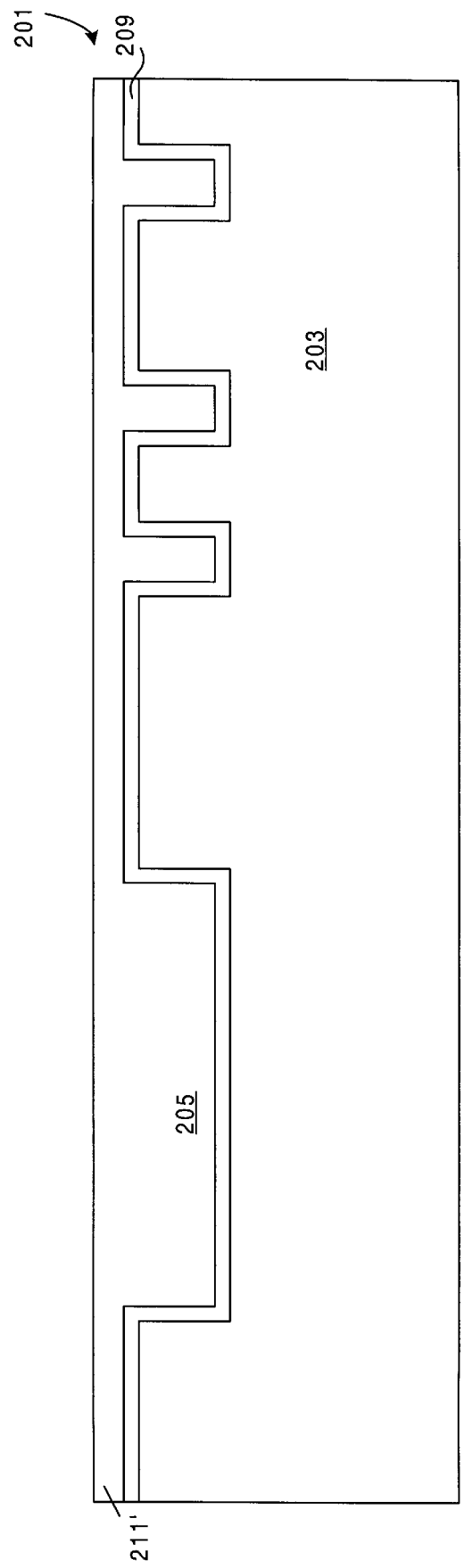
FIG. 7 is a cross-sectional depiction of the structure of FIG. 5 after electropolishing has been completed and any residual diffusion barrier layer has been removed.
Figure 8:
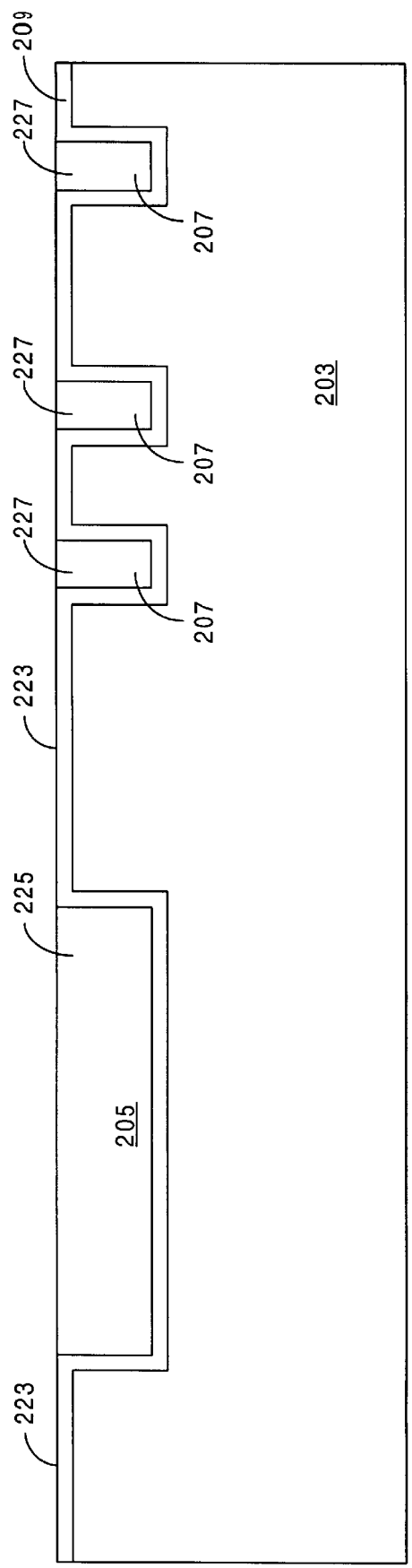
FIG. 8 is a cross-sectional depiction of the structure of FIG. 7 after a portion of the electropolished conductive layer has been removed to expose upper surfaces of the patterned dielectric layer.

After electropolishing is completed, conductive material layer 211 will be substantially planarized, and recess 213 will be removed. The structure shown in FIG. 7 illustrates a planar conductive layer 211'. In some embodiments, the structure depicted in FIG. 7 will be a suitable end product of the process. However, in damascene processing and other related processes, it will be necessary to remove the upper portion of layer 211' so that the field regions of dielectric layer 203 are exposed. A process that uniformly removes material over the substrate surface may accomplish this. Examples of such processes include chemical mechanical polishing, a second electropolishing procedure, electroetching, and wet etching. In alternative embodiments, uniform removal may be accomplished via a further electrolytic process such as a modified version of electropolishing. In any event, the end result is illustrated in FIG. 8. As shown there, field regions 223 of dielectric layer 203 are exposed. Within trenches 205 and 207 are conductive structures 225 and 227, respectively.

As suggested above, the selectively deposited diffusion barrier film may take various forms. It may be soluble, insoluble, or partially soluble in the primary electropolishing bath electrolyte. Importantly, it will retard diffusion of those species necessary for electropolishing. Such species include ions of the conductive material being polished (e.g., copper ions or other ions resulting from oxidation of the material in conformal layer 211). Thus, the diffusion coefficient for such species in the diffusion barrier film will be smaller than the corresponding diffusion coefficient in the electropolishing bath electrolyte. In certain embodiments, the diffusion coefficient of the film may be so small that the film effectively blocks all the diffusion of relevant species to and from the underlying conductive material layer.

In particularly preferred embodiments, the film diffusion coefficient for the relevant species varies inversely with the concentration of the species in the diffusion barrier film. For example, the film may have a relatively high diffusion coefficient for cupric ions when the concentration of such ions in the film is very low. However, as the concentration of cupric ions increases within the film, the diffusion coefficient for such ions decreases, thereby slowing diffusion of cupric ions through the film. In a particularly preferred embodiment, the relation between diffusion coefficient and species concentration varies non-linearly. For example, if the concentration of cupric ions in the film increases by a set amount, the diffusion coefficient may decrease by more than a proportionate amount based upon the increase in cupric ion concentration.

In one preferred embodiment, the diffusion barrier film is formed from a viscous liquid that is at least partially soluble in the electropolishing bath electrolyte. Examples of such suitable viscous liquids include concentrated phosphoric acid, concentrated sulfuric acid, boric acid, glacial acetic acid, ethylene glycol, propylene glycol, and mixtures of these.

Note that in the case of a concentrated phosphoric acid film, film application may require that the concentrated phosphoric acid be heated to ensure that it flows sufficiently well to cover the substrate surface. In a particularly preferred embodiment, a heated phosphoric acid solution is applied by spraying onto a rotating substrate.

If an appropriate thickness of such polishing film is applied (e.g., on the order of from 0.5 to 10 times the feature depth), substantial differences in electropolishing rates between the bottom of a low aspect ratio feature and the substantially flat field areas can be obtained. This is unlike the electropolishing process in an electropolishing bath in which the controlling polishing film is generated from an initially homogeneous solution with concentration gradients generated during the process. The discontinuity in physical properties between the film and bulk electrolyte bath in this invention enables the polishing process to be controlled, at least partially, by the applied film thickness and properties.

The actual amount (thickness) and type of film selectively applied will depend on the various processing parameters chosen (i.e. rotation rate, electrolyte bath, temperature, etc.) and substrate properties. Films with relatively high solubilities and relatively low viscosities should be applied relatively thickly. During the time when the part is being rotated in the bath (n.b., rotation is necessary to maintain a constant polishing rate and remove metal from the surface), the film will also dissolve slowly. Therefore, for a given amount of metal to be removed, one needs to determine the appropriate amount of applied film required. The thickness of the film and it properties will affect the process rate, longevity, and leveling characteristics.

In the case of a concentrated phosphoric acid film, for example, other components may be employed to control its viscosity, conductivity, etc. These components may include, for example, water, propylene carbonate, ethylene carbonate, and sulfuric acid. In a preferred embodiment, a phosphoric acid diffusion barrier film has a concentration of at least about 25 weight percent phosphoric acid. More preferably, the film has a phosphoric acid concentration of between about 40 and 85% by weight. Taking a different view of desirable compositions, the films preferably have less than 50% water, more preferably less than 25% water, and most preferably less than 15% water.

Another component of such phosphoric acid film is a salt (or salts) of the material to be removed. For example, if the material to be removed is copper, the phosphoric acid film should have some salts of copper such as copper sulfate ($CuSO_4$), copper phosphate ($Cu_3(PO_4)_2$), cupric monhydrogen phosphate ($CuHPO_4$), copper monohydroxy phosphate ($Cu_2(OH)PO_4$), cupric oxide (CuO), and copper nitrate ($Cu(NO_3)_2$). Such salts are added to allow immediate plating of the polished metal on the counter electrode (a cathode during electropolishing) and thereby avoid generation of bubbles from the electrolysis of the electrolyte at the counter electrode. As suggested above, such bubbles can very negatively impact the quality of electropolished film at the substrate (and potentially create a safety hazard). In a specific example, the concentration of cupric salts in the film is at least about 0.1 mole/liter, more preferably at least about 0.25 mole/liter, and most preferably at least about 0.5 mole/liter.

Another component that may be added to the viscous liquid film may be a surface agent such as a wetting agent, a brightening agent, or an agent that effectively increases the kinetic overpotential to provide more uniform electropolishing or deposition over the substrate or counter electrode, respectively. Examples of wetting agents include sodium lauryl sulfate (e.g., between about 0–2% by weight), and various co-polymers of ethylene oxide (EO) and proplyene oxide (PEO). Examples of brightening agents include cummerin, benzotriazole, mercaptopropane sulphonic acid and di-mercaptopropance sulphonic acid. Examples of materials that promote more uniform plating include polyethylene glycol, polyethylene oxide, polypropylene oxide, polypropylene glycol, and copolymers of any of these. In addition, 0 to 1 mole/liter tetraethylammonium tetrafluoroborate or dodecyl trimethyl ammonium tetrafluoroborate (other electrochemical stable anions that are oxidatively stable with respect to water) may be used as a supporting electrolyte to reduce the overall potential drop of the electropolishing process, as well as to enhance the polishing performance.

In the above examples, the diffusion barrier film is partially soluble in the bath electrolyte and conductive to ions from the conductive layer. Three other classes of diffusion barrier will now be described. In preferred embodiments, the diffusion barrier films employed in these embodiments comprise polymeric materials (e.g., organic and silicone polymers in either a liquid or gel state, possibly dissolved in a solvent). As in the above-described embodiments, the polymeric films are applied prior to the wafer being processed in the electropolishing bath. Generally, the goals and processing outlined above apply when polymer films are used. Specifically, a goal of the processes discussed below is to produce a polymer film with a film thickness greater in the low aspect ratio features areas, thereby essentially planarizing the surface with the polymer (see FIGS. 4 and 5 ). A wide range of polymer types can be used, though the method of their use depends on the polymer's properties. Three types of applied polymeric films are discussed below.

Case 1—Non Ionically Conducting Film Material, Insoluble in Electropolishing Bath Electrolyte These diffusion barrier films should essentially block all diffusion of ions necessary for electropolishing. They should also be essentially insoluble in the bath electrolyte. When using an aqueous electropolishing bath electrolyte, examples of suitable diffusion barrier polymers include polyvinylidene difluoride, polyvinyl chloride, and ethylene propylene diene monomer. When using a non-aqueous electropolishing bath electrolyte such as propylene carbonate, ethylene carbonate, dimethyl carbonate, diethyl carbonate, or a mixture of these, examples of suitable diffusion barrier polymers include polyvinylidene difluoride, and ethylene propylene diene monomer. In a specific example, the film made from polyvinylidene difluoride dissolved in dimethylformamide (DMF) or 1-methyl-2-pyrrolidinone (NMP).

The overall process of this embodiment may be similar to that described above and illustrated in FIGS. 2–8, except that the diffusion barrier film does not dissolve during electropolishing. In a specific embodiment, the film is applied as a liquid (melted or dissolved in an appropriate solvent). It is then dried/cooled to leave an essentially planarized surface covered with polymer or other suitable film material (see FIGS. 4 and 5 ). The film may be applied as a dissolved solid, which is subsequently dried. A polymer melting step may follow to achieve planarization. Next, the electrically and ionically insulating film should be removed from the field regions of the conductive layer so that those areas are active in the electropolishing process. This can be accomplished by such methods as spraying the surface with a solvent (same or different than before) while the part is spinning at a high rate. The resultant structure has a diffusion barrier film in the low aspect ratio features (making them inactive or less active to the polishing process), but has exposed conductive material in the field regions, devoid of the insulating barrier film (FIG. 5). The part can then be electropolishing in any appropriate apparatus to leave a thin film of conductive material in the field region, and a conductive material filled region in the low aspect ratio features (see FIGS. 6 and 7 ). Any remaining conductive material in the field and the polymer in the low aspect ratio features can be removed by a CMP process, or alternatively by wet etching the surface followed by the removal of the polymer in the low aspect ratio features by placing the part in an appropriate organic solvent. (see FIG. 8)

Case 2—Non Ionically Conducting Film Material, Soluble in Electropolishing Bath Electrolyte This case is similar to case 1, but the diffusion barrier film is removed in-situ during the electropolishing process because the film material is significantly soluble in the bath. Thus, the process is rather similar to that depicted in FIGS. 2–8. Note that because the film is non-conductive essentially no conductive material will be removed from the recessed areas covered by film.

The film materials used in this embodiment should essentially block all diffusion of ions necessary for electropolishing, but should also be at least partially soluble in the bath electrolyte. Thus, during electropolishing, they should partially dissolve to allow gradual removal of conductive material at the edges of the recesses. This approach has the potential advantage over case 1 in reducing the number of processing step to achieve the same structural end, but the continued dissolution of the film material into the bath may reduce the bath's longevity and complicate bath composition control. When using an aqueous electropolishing bath electrolyte, examples of suitable diffusion barrier polymers include amide resins such as the nylons (e.g., nylon 66), and acetal resins such DELRIN® available from DuPont Corporation. When using a non-aqueous electropolishing bath electrolyte such as propylene carbonate, ethylene carbonate, dimethyl carbonate, diethyl carbonate, or a mixture of these, examples of suitable diffusion barrier polymers include polyacrylonitrile (PAN) and polymethylacrylonitrile (PMAN). In a specific embodiment, the barrier film is formed from a nylon dissolved in acetone and the electropolishing bath electrolyte is 85% phosphoric acid with water as the balance.

Case 3—Ionically Conducting Film Material, Insoluble in Electropolishing Bath Electrolyte In this case, the diffusion barrier film can conduct metal ions and serve as a differential diffusion barrier for mass transfer from the regions of the field and from large aspect ratio areas. In regions where the film is thinnest (field areas), the rate of removal of metal ion is largest. In regions where the film is thickest (low aspect ratio areas), the removal of metal ion is slowest. This results because the local current density will be inversely proportional to the film thickness, as shown by expression for current density (a thermodynamic measure of the rate at which conductive material is removed).

$$i = \frac{nFD\Delta C}{x}.$$

In this equation, i is the local current density (proportional to the local metal removal rate), D is the diffusion coefficient for the metal ion, $\Delta C$ is the concentration difference across the film, and x is the local film thickness. It is assumed in the above equation that the diffusion in the bath electrolyte is much greater than in the film. (Typically ion diffusion in ionically conducting polymers is 2–3 orders of magnitudes lower than in liquids, making this assumption a good one.) The above equation shows that, in order to achieve good selectivity for conductive material removal between the field and low aspect ratio feature areas, the film must be as thin as possible in the field, and fully fill the trench.

One advantage of electropolishing using the applied ionically conducting polymer film is that complete removal of field metal is possible without further processing steps. Because the rate controlling process is diffusion through an adherent "two-dimensional" film, removal rates of metals from embedded conductors will not be accelerated as the field regions run out of metal (i.e. when they clear from the dielectric). The high diffusion resistance of the film and the fact that the film thickness is approximately equal to or less than the smallest embedded metal feature (trench depth) inhibits significant enhancement of metal removal when metal is no longer supplied from regions near the embedded conductor. The resistance to diffusion is not significantly changed by the new, very thin diffusion path offered by lower concentration of metal in the directions more parallel to the surface.

Processes employing barrier materials in this case may follow the sequence illustrated in FIGS. 2–8. Note that because the film is insoluble it will not dissolve, unlike the situation illustrated in FIG. 6. In this case, when using an aqueous electropolishing bath electrolyte, examples of suitable diffusion barrier polymers include polyacrylonitrile, or polyvinylidene difluoride. When using a non-aqueous electropolishing bath electrolyte such as propylene carbonate, ethylene carbonate, dimethyl carbonate, diethyl carbonate, or a mixture of these, examples of suitable diffusion barrier polymers include polyacrylonitrile, and polyvinylidene difluoride. In a specific embodiment, the diffusion barrier film is formed from polyacrylonitrile dissolved in propylene carbonate.

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of forming conductive features via a damascene process, the method comprising:
   providing a partially fabricated integrated circuit having a dielectric layer with trenches where said conductive features are to be formed;
   forming a substantially conformal layer of conductive material over the dielectric layer, whereby the conductive material has a surface comprising recesses over the trenches and substantially flat field regions around the trenches;
   selectively applying a diffusion barrier film to the recesses;
   electropolishing the conductive material surface, whereby the conductive material is removed from the recesses more slowly than from the field regions to thereby increase the planarity of the conductive material surface; and
   removing the conductive material at a substantially uniform rate over the surface of the conductive material until reaching the dielectric layer, whereby said conductive features remain in said trenches, insulated from one another by regions of the dielectric layer.

2. The method of claim 1, wherein the conductive features include at least one of interconnect lines and contact pads.

3. The method of claim 1, wherein the dielectric layer is formed of a material selected from the group consisting of silicon oxides, aluminum nitride, paraffin, and organic and inorganic aerogels.

4. The method of claim 1, wherein the trenches have an aspect ratio of at most about 1:1.

5. The method of claim 1, wherein the trenches have an aspect ratio of at most about 1:3.

6. The method of claim 1, wherein forming the substantially conformal layer comprises electroplating the conductive material onto the dielectric layer.

7. The method of claim 1, wherein forming the substantially conformal layer comprises using a process selected from the group comprising chemical vapor deposition, sputtering, and evaporation.

8. The method of claim 1, wherein the conductive material is a metal.

9. The method of claim 1, wherein the conductive material is copper or an alloy of copper.

10. The method of claim 1, wherein the diffusion barrier film is a liquid film or a polymer film.

11. The method of claim 10, wherein the diffusion barrier film is a liquid film including at least about 25% phosphoric acid by weight and a salt of the conductive material.

12. The method of claim 1, wherein the diffusion barrier film comprises a polymeric film selected from the group consisting of a nylon, polyvinylidene difluoride, polyacrylonitrile, polymethylacrylonitrile, ethylene propylene diene monomer, and polyvinylchloride.

13. The method of claim 1, wherein removing the conductive material at a substantially uniform rate comprises chemical mechanical polishing, wet etching, a second electropolishing procedure, or electroetching.

14. A method of electroplanarizing a substrate surface having recesses surrounded by substantially flat field regions, the method comprising:

selectively applying a diffusion barrier film to the recesses; and electropolishing the substrate surface, whereby material is removed from the recesses more slowly than from the field regions to thereby increase the planarity of the substrate surface.

15. The method of claim 14, wherein the substrate is a partially fabricated integrated circuit.

16. The method of claim 14, wherein the substrate surface is a surface of a metal layer that conformally coats a dielectric layer with damascene features.

17. The method of claim 14, wherein the recesses have an aspect ratio of at most about 1:1.

18. The method of claim 14, wherein the diffusion barrier film is applied in a manner providing it with a substantially planar surface.

19. The method of claim 18, wherein the diffusion barrier film is applied by a process selected from the group consisting of dipping, spraying, and metering.

20. The method of claim 19, wherein the diffusion barrier film is planarized by spraying the surface of the film with a solvent for the film while the substrate is spinning.

21. The method of claim 14, wherein the diffusion barrier film has a diffusion coefficient for ions of the material to be removed that is lower than an electropolishing bath electrolyte diffusion coefficient for said ions, wherein the bath electrolyte is used during the electropolishing.

22. The method of claim 14, wherein the diffusion barrier film has a diffusion coefficient for ions of the material to be removed that varies inversely with the concentration of said ions in the diffusion barrier film.

23. The method of claim 14, wherein the diffusion barrier film is a viscous liquid that is soluble in an electropolishing bath electrolyte.

24. The method of claim 23, wherein the diffusion barrier film is phosphoric acid having a concentration of at least about 25% by weight.

25. The method of claim 24, wherein the diffusion barrier film contains phosphoric acid in a concentration of between about 40 and 85% by weight.

26. The method of claim 24, wherein the diffusion barrier film includes one or more of water, propylene carbonate, and ethylene carbonate.

27. The method of claim 23, wherein the diffusion barrier film further comprises a salt of the material to be removed.

28. The method of claim 23, wherein the diffusion barrier film further comprises a surface agent selected from the group consisting of wetting agents, brightening agents, and compounds that increase the kinetic overpotential of an electropolishing cathode.

29. The method of claim 14, wherein the diffusion barrier film is insoluble in an electropolishing bath electrolyte used during the electropolishing.

30. The method of claim 14, wherein the diffusion barrier film is non-conductive to ions generated from the substrate during the electropolishing.

31. The method of claim 14, wherein the diffusion barrier film comprises a polymeric film selected from the group consisting of a nylon, polyvinylidene difluoride, polyacrylonitrile, polymethylacrylonitrile, ethylene propylene diene monomer, and polyvinylchloride.

32. The method of claim 14, wherein electropolishing is performed in an electropolishing bath electrolyte having a lower viscosity and higher conductivity than the diffusion barrier film.

* * * * *